(12) United States Patent
Nieh et al.

(10) Patent No.: US 8,870,974 B2
(45) Date of Patent: Oct. 28, 2014

(54) THIN FILM BATTERY FABRICATION USING LASER SHAPING

(75) Inventors: Kai-Wei Nieh, Monrovia, CA (US); Jianchao Li, El Monte, CA (US); Tung-Hsiu Shih, Ceritos, CA (US)

(73) Assignee: Front Edge Technology, Inc., Baldwin Park, CA (US)

( * ) Notice: Subject to any disclaimer, the term of this patent is extended or adjusted under 35 U.S.C. 154(b) by 360 days.

(21) Appl. No.: 12/032,997

(22) Filed: Feb. 18, 2008

(65) Prior Publication Data
US 2009/0208671 A1   Aug. 20, 2009

(51) Int. Cl.
| | |
|---|---|
| H01M 4/82 | (2006.01) |
| H01M 10/0525 | (2010.01) |
| H01M 6/40 | (2006.01) |
| H01M 4/38 | (2006.01) |
| C23C 14/18 | (2006.01) |
| C23C 14/02 | (2006.01) |
| H01M 4/1391 | (2010.01) |
| H01M 10/0585 | (2010.01) |
| H01M 10/0562 | (2010.01) |
| H01M 4/139 | (2010.01) |
| C23C 14/35 | (2006.01) |
| H01M 4/66 | (2006.01) |
| H01M 4/70 | (2006.01) |

(52) U.S. Cl.
CPC ............. *C23C 14/185* (2013.01); *Y02E 60/122* (2013.01); *H01M 10/0525* (2013.01); *H01M 6/40* (2013.01); *H01M 4/382* (2013.01); *C23C 14/025* (2013.01); *H01M 4/661* (2013.01); *H01M 4/1391* (2013.01); *H01M 10/0585* (2013.01); *H01M 4/70* (2013.01); *H01M 10/0562* (2013.01); *H01M 4/139* (2013.01); *C23C 14/35* (2013.01)

USPC ........................................................ 29/623.1

(58) Field of Classification Search
None
See application file for complete search history.

(56) References Cited

U.S. PATENT DOCUMENTS

| | | |
|---|---|---|
| 3,375,135 A | 3/1968 | Moulton et al. |
| 3,414,685 A | 12/1968 | Geib et al. |
| 3,530,007 A | 9/1970 | Golubovic |
| 3,844,841 A | 10/1974 | Baker |
| 3,969,142 A | 7/1976 | Greatbatch et al. |
| 3,993,508 A | 11/1976 | Erlichman |
| 4,309,494 A | 1/1982 | Stockel |

(Continued)

FOREIGN PATENT DOCUMENTS

| | | |
|---|---|---|
| CN | 1661354A A | 8/2005 |
| EP | 0 829 913 A | 3/1998 |

(Continued)

OTHER PUBLICATIONS

PCT Search Report and Written Opinion in re: PCT/US208/005462, Jul. 27, 2008.

(Continued)

*Primary Examiner* — Barbara Gilliam
*Assistant Examiner* — Adam A Arciero
(74) *Attorney, Agent, or Firm* — Ashok K. Janah; Janah & Associates, PC

(57) ABSTRACT

A method of fabricating a battery comprises selecting a battery substrate having cleavage planes, and depositing on the battery substrate, one or more battery component films comprising electrode films that at least partially surround an electrolyte film. Pulsed laser beam bursts are applied to the battery component films at a sufficiently high power level to vaporize portions of the films to form shaped battery features. The pulsed laser bursts shape the films substantially without causing fractures along the cleavage planes of the battery substrate. Pulsed laser shaping can be used to replace the use of a mask in the fabrication of shaped battery components.

20 Claims, 6 Drawing Sheets

(56) References Cited

U.S. PATENT DOCUMENTS

| | | |
|---|---|---|
| 4,421,835 A | 12/1983 | Manassen et al. |
| 4,459,328 A | 7/1984 | Mizuhara |
| 4,543,441 A | 9/1985 | Kumada et al. |
| 4,565,753 A | 1/1986 | Goebel et al. |
| 4,597,844 A | 7/1986 | Hiraki et al. |
| 4,619,865 A | 10/1986 | Keem et al. |
| 4,663,183 A | 5/1987 | Ovshinsky et al. |
| 4,698,256 A | 10/1987 | Giglia et al. |
| 4,714,660 A | 12/1987 | Gates, Jr. |
| 4,725,345 A | 2/1988 | Sakamoto et al. |
| 4,777,090 A | 10/1988 | Ovshinsky et al. |
| 4,871,433 A | 10/1989 | Wagner et al. |
| 4,873,115 A | 10/1989 | Matsumura et al. |
| 4,877,677 A | 10/1989 | Hirochi et al. |
| 4,904,542 A | 2/1990 | Mroczkowski |
| 4,996,079 A | 2/1991 | Itoh |
| 5,019,467 A | 5/1991 | Fujiwara |
| 5,171,413 A | 12/1992 | Arntz et al. |
| 5,197,889 A | 3/1993 | Rizzo et al. |
| 5,240,794 A | 8/1993 | Thackeray et al. |
| 5,249,554 A | 10/1993 | Tamor et al. |
| 5,262,028 A | 11/1993 | Manley |
| 5,330,853 A | 7/1994 | Hofmann et al. |
| 5,338,625 A | 8/1994 | Bates et al. |
| 5,368,939 A | 11/1994 | Kawamura et al. |
| 5,445,906 A | 8/1995 | Hobson et al. |
| 5,478,456 A | 12/1995 | Humpal et al. |
| 5,490,911 A | 2/1996 | Makowiecki et al. |
| 5,503,912 A | 4/1996 | Setoyama et al. |
| 5,511,587 A | 4/1996 | Miya et al. |
| 5,512,147 A | 4/1996 | Bates et al. |
| 5,512,387 A | 4/1996 | Ovshinsky |
| 5,516,340 A | 5/1996 | Takeuchi et al. |
| 5,547,767 A | 8/1996 | Paidassi et al. |
| 5,552,242 A | 9/1996 | Ovshinsky et al. |
| 5,554,456 A * | 9/1996 | Ovshinsky et al. ............ 429/59 |
| 5,597,660 A | 1/1997 | Bates et al. |
| 5,612,152 A | 3/1997 | Bates |
| 5,656,364 A | 8/1997 | Rickerby et al. |
| 5,670,252 A | 9/1997 | Makowiecki et al. |
| 5,670,272 A | 9/1997 | Cheu et al. |
| 5,700,551 A | 12/1997 | Kukino et al. |
| 5,705,293 A | 1/1998 | Hobson |
| 5,705,297 A | 1/1998 | Warren |
| 5,786,582 A | 7/1998 | Roustaei et al. |
| 5,824,374 A * | 10/1998 | Bradley et al. ................ 427/555 |
| 5,871,865 A | 2/1999 | Barker et al. |
| 5,894,656 A | 4/1999 | Menon et al. |
| 5,961,672 A | 10/1999 | Skotheim et al. |
| 5,985,485 A | 11/1999 | Ovshinsky et al. |
| 6,017,654 A | 1/2000 | Kumta et al. |
| 6,022,640 A | 2/2000 | Takada et al. |
| 6,118,248 A | 9/2000 | Gartstein et al. |
| 6,146,715 A * | 11/2000 | Kim et al. .................... 427/555 |
| 6,148,503 A | 11/2000 | Delnick et al. |
| 6,168,884 B1 | 1/2001 | Neudecker et al. |
| 6,197,450 B1 | 3/2001 | Nathan et al. |
| 6,217,623 B1 | 4/2001 | Reichert et al. |
| 6,218,049 B1 * | 4/2001 | Bates et al. ................. 429/231.5 |
| 6,238,847 B1 * | 5/2001 | Axtell et al. .................. 430/322 |
| 6,242,129 B1 | 6/2001 | Johnson |
| 6,264,709 B1 | 7/2001 | Yoon et al. |
| 6,280,875 B1 | 8/2001 | Kwak et al. |
| 6,287,711 B1 | 9/2001 | Nieh et al. |
| 6,340,880 B1 | 1/2002 | Higashijima et al. |
| 6,379,835 B1 | 4/2002 | Kucherovsky et al. |
| 6,387,039 B1 | 5/2002 | Moses |
| 6,387,563 B1 | 5/2002 | Bates |
| 6,398,824 B1 | 6/2002 | Johnson |
| 6,402,796 B1 | 6/2002 | Johnson |
| 6,411,780 B1 | 6/2002 | Maruyama |
| 6,517,968 B2 | 2/2003 | Johnson |
| 6,558,836 B1 | 5/2003 | Whitacre et al. |
| 6,632,563 B1 * | 10/2003 | Krasnov et al. ............... 429/162 |
| 6,636,017 B2 | 10/2003 | Zink et al. |
| 6,645,658 B2 | 11/2003 | Morozumi |
| 6,658,124 B1 | 12/2003 | Meadows |
| 6,661,197 B2 | 12/2003 | Zink et al. |
| 6,713,987 B2 | 3/2004 | Krasnov et al. |
| 6,863,699 B1 | 3/2005 | Krasnov et al. |
| 6,921,464 B2 | 7/2005 | Krasnov et al. |
| 6,940,988 B1 | 9/2005 | Shennib et al. |
| 7,037,621 B2 | 5/2006 | Kikuchi et al. |
| 7,056,620 B2 | 6/2006 | Krasnov et al. |
| 7,186,479 B2 | 3/2007 | Krasnov et al. |
| 7,286,479 B2 | 10/2007 | Bragg |
| 7,862,627 B2 * | 1/2011 | Li et al. ....................... 29/623.5 |
| 2001/0041294 A1 | 11/2001 | Chu et al. |
| 2002/0004167 A1 | 1/2002 | Jenson et al. |
| 2002/0028384 A1 * | 3/2002 | Krasnov et al. ............... 429/238 |
| 2002/0071989 A1 | 6/2002 | Verma et al. |
| 2002/0110733 A1 | 8/2002 | Johnson |
| 2002/0150823 A1 | 10/2002 | Breitkopf et al. |
| 2003/0121142 A1 | 7/2003 | Kikuchi et al. |
| 2003/0152829 A1 | 8/2003 | Zhang et al. |
| 2003/0160589 A1 | 8/2003 | Krasnov et al. |
| 2004/0018424 A1 | 1/2004 | Zhang et al. |
| 2004/0064937 A1 | 4/2004 | Krasnov et al. |
| 2004/0086762 A1 | 5/2004 | Maeda et al. |
| 2005/0079418 A1 * | 4/2005 | Kelley et al. ............. 429/231.95 |
| 2005/0130032 A1 | 6/2005 | Krasnov et al. |
| 2005/0156573 A1 | 7/2005 | Lin |
| 2006/0040169 A1 | 2/2006 | Liu et al. |
| 2006/0040170 A1 | 2/2006 | Liu et al. |
| 2006/0068258 A1 | 3/2006 | Kinoshita |
| 2006/0115706 A1 | 6/2006 | Maeda et al. |
| 2006/0216589 A1 | 9/2006 | Krasnov et al. |
| 2007/0037054 A1 | 2/2007 | Kikuchi et al. |
| 2007/0047750 A1 | 3/2007 | Sauer et al. |
| 2007/0047796 A1 | 3/2007 | Anantharaman |
| 2007/0104343 A1 | 5/2007 | Bengtsson et al. |
| 2007/0104344 A1 | 5/2007 | Goldberg |
| 2007/0125638 A1 | 6/2007 | Zhang et al. |
| 2007/0141460 A1 | 6/2007 | You et al. |
| 2007/0166612 A1 | 7/2007 | Krasnov et al. |
| 2008/0213664 A1 | 9/2008 | Krasnov et al. |
| 2008/0263855 A1 | 10/2008 | Li et al. |
| 2009/0010462 A1 | 1/2009 | Ekchian et al. |
| 2009/0057136 A1 | 3/2009 | Wang et al. |
| 2010/0028767 A1 | 2/2010 | Inose et al. |

FOREIGN PATENT DOCUMENTS

| | | |
|---|---|---|
| EP | 1 458 037 A | 9/2004 |
| FR | 2 403 652 A | 4/1979 |
| GB | 2251119 A | 6/1992 |
| JP | 59-032023 A | 2/1984 |
| JP | 59-226472 A | 12/1984 |
| JP | 60-072168 | 4/1985 |
| JP | 61195563A A | 8/1986 |
| JP | 09-259929 A | 10/1997 |
| JP | 2001-044073 A | 2/2001 |
| JP | 2003-249199 A | 9/2003 |
| JP | 2009123516 | 6/2009 |
| WO | WO-95/14311 A | 5/1995 |
| WO | WO-99/23714 | 5/1999 |
| WO | WO-00/60689 A | 10/2000 |
| WO | WO-01/73873 A | 10/2001 |
| WO | WO-02/21627 A3 | 1/2003 |
| WO | WO-02/42516 A3 | 1/2003 |
| WO | WO-03/061049 A | 7/2003 |
| WO | WO-03/073531 A3 | 12/2003 |
| WO | WO-03/005477 A3 | 12/2004 |
| WO | WO-2006/105050 A3 | 3/2007 |
| WO | WO2008101254 | 8/2008 |
| WO | WO-2008/108999 A3 | 11/2008 |
| WO | WO-2008/134053 A1 | 11/2008 |

OTHER PUBLICATIONS

Bates et al., "Preferred orientation of polycrystalline LiCoO2 films" J. of the Electrochemical Society (2000), pp. 59-70, Issue No. 147 (1).

(56) References Cited

OTHER PUBLICATIONS

Roh et al., "Effects of deposition condition on the ionic conductivity . . . " Scripta, Materialia, Dec. 17, 1999, pp. 43-49, vol. 42. No. 1, New York, NY.

Bolster et al., "Investigation of lithium intercalation metal oxides for thermalbatteries" Proceedings of the 34th Int'l Power Source Symposium, Jun. 25-28, 1990, pp. 136-140.

Wagner et al., "Fabrication and Testing of thermoelectric thin film devices" 15th Int'l Conf. on Thermoelectrics, Mar. 26-29, 1996, pp. 269-273.

Neudecker et al., "Lithium-Free Thin-Film Battery . . . " Journal of the Electrochemical Society (2000), pp. 517-523, Issue No. 147 (2).

Park et al., "Characterization of tin oxide/LiMn2O4 thin-film cell," Journal of Power Sources, Jun. 2000, pp. 250-254, vol. 88, No. 2, Elsevier Science S.A.

Yang et al., "Effect of annealing temperature on structure and electrochemical properties of $LiCoO_2$ cathode thin films", Rare Metals, vol. 25, Dec. 2006, pp. 189-192.

Mattox, Donald M., Handbook of Physical Vapor Deposition (PVD) Processing, Film Formation, Adhesion, Surface Preparation and Contamination Control, 1998, pp. 127-135 and 343-364, Noyes Publications, Westwood, New Jersey, USA.

Antaya et al. "Preparation and Characterization of $LiCoO_2$ Thin Films by Laser Ablation Deposition", J. Electrochem. Soc., vol. 140, No. 3, Mar. 1993, pp. 575-578.

Fragnaud et al. "Characterization of sprayed and sputter deposited LiCoO2 thin films for rechargeable microbatteries", J. Power Sources, 63 (1996), pp. 187-191.

Birke et al. "Materials for lithium thin-film batteries for application in silicon technology", Solid State Ionics, 93 (1997), pp. 1-15.

Benqlilou-Moudden et al. "Amorphous Lithium Cobalt and Nickel Oxides Thin Films Preparation and Characterization by RBS and PIGE", Thin Solid Films 333 (1998), pp. 16-19.

Jenson, Mark, U.S. Provisional Patent Application (unpublished) U.S. Appl. No. 60/191,774, "Comprehensive patent for the fabrication of a high volume, low cost energy products such as solid state lithium ion rechargeable battery, supercapacitors and fuel cells", filed Mar. 24, 2000.

Jenson et al., U.S. Provisional Patent Application (unpublished) U.S. Appl. No. 60/225,134, "Apparatus and method for rechargeable batteries and for making and using batteries", Aug. 14, 2000.

Jenson et al., U.S. Provisional Patent Application (unpublished) U.S. Appl. No. 60/238,673, "Battery Having Ultrathin Electrolyte", filed Oct. 6, 2000.

Krasnov et al., U.S. Patent Application (unpublished) U.S. Appl. No. 11/946,819, "Thin Film Battery Comprising Stacked Battery Cells and Method", filed Nov. 28, 2007.

* cited by examiner

US 8,870,974 B2

THIN FILM BATTERY FABRICATION USING LASER SHAPING

BACKGROUND

Embodiments of the present invention relate to thin film batteries and their fabrication on a substrate.

Thin film batteries are used in various applications, such as portable electronics, medical devices and space systems. A thin film battery typically comprises a substrate having one or more battery component films that include an electrolyte sandwiched between electrode films such an anode, cathode, and/or current collector films, that cooperate to store electrical charge and generate a voltage. The battery component films are thinner than conventional batteries, for example, they can be less than 100 microns. The small thickness dimension allows a thin film battery to have a thickness which is less than about a hundredth that of a conventional battery. Thin films used as battery component films are formed by processes, such as physical and chemical vapor deposition (PVD or CVD), oxidation, nitridation, and electroplating processes.

Conventional substrates used in the fabrication of thin film batteries can constrain the minimum dimensions of the battery. Thin film batteries are often used in applications which require a battery with high energy density and/or specific energy. The energy density level is the fully charged output energy level per unit volume of the battery, and the specific energy level is the fully charged output energy level per unit weight of the battery. However, conventional substrates often need to have a certain thickness to provide adequate mechanical support for the thin films formed on the substrate. The relatively thick substrates, limit the maximum energy density and specific energy levels that can be obtained from the resultant and film battery. Battery performance can be improved by using thin plate-like substrates, such as for example, ceramic substrates composed of $Al_2O_3$ or $SiO_2$, to increase the energy to volume/weight ratio of the battery.

Crystalline substrates with cleavage planes can also be used to increase the energy density and specific energy levels of thin film batteries. These crystalline materials are typically relatively strong along the direction of the cleavage plane, and can also be light weight. For example, commonly assigned U.S. Pat. No. 6,632,563 to Kraznov et al., which is incorporated herein by reference in its entirety, describes a mica substrate which meets these requirements. The mica substrate reduces the total weight and volume of the battery while providing good mechanical strength and dielectric strength, at least partly because the flat planar structure and cleavage properties of mica allow it to be split into thin foils along its cleavage planes. A mica substrate can be very thin, and can even have thicknesses of less than about 100 microns, or even less than about 25 microns.

Conventional thin film fabrication methods, which are used to shape the battery component films on the substrate to form a three-dimensional battery structure, can also have problems. Typically, the battery component films, such as the cathode, electrolyte, etc., are shaped to form particular shapes, using successive masking and deposition process steps. In these methods, a mask comprising patterned apertures is positioned or deposited as a layer on top of a mica substrate. Thereafter, a second layer is deposited onto the underlying substrate surface through the patterned apertures of the mask to form features. Successive masking and deposition steps are used to build up a three-dimensional shaped structure for the thin film battery. However, conventional masking methods can have undesirable effects when used on a crystalline substrate having cleavage planes. For instance, when the mask is peeled back from the substrate in these processes, it can cause splitting along cleavage planes or fracture across the planes at portions of the substrate adjacent to the interface between the mask aperture and material deposited through the aperture. The edge of the mask can also stick to the underlying substrate material, and when peeled back, remove a portion of a plate-like layer of a substrate at a cleavage plane, or result in a non-uniform or broken edge of the feature being formed through the aperture in the mask.

Thus it is desirable to form a three-dimensional structure of battery component films on a battery substrate without the excessive use of masks to define the shape of the features. It is further desirable to shape battery component films on the substrate without forming non-uniform or broken edges of the shaped features of the films. It is also desirable to reduce the number of handling steps in the fabrication of a thin film battery to reduce contamination and stress fractures, and increase process throughput.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
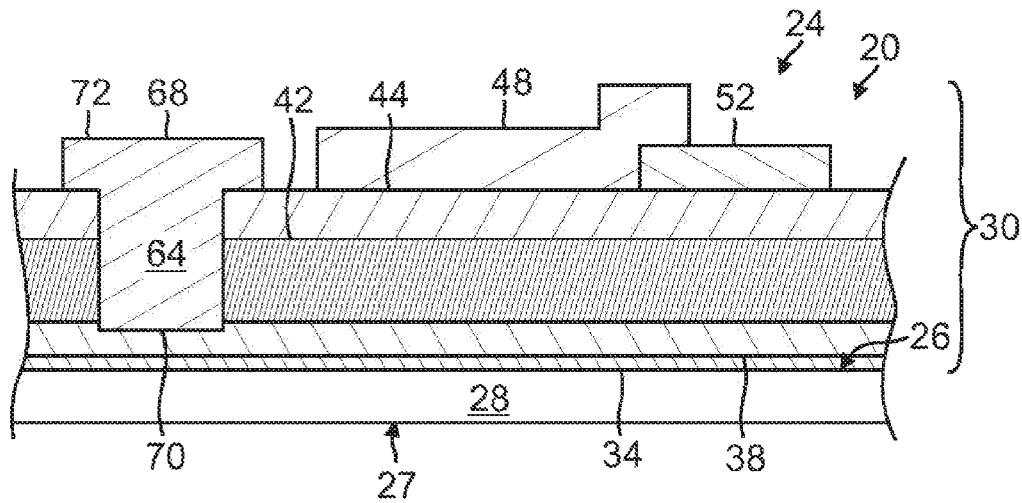
FIG. 1 is a schematic sectional side view of a single-sided battery.

An embodiment of a thin film battery 20 comprising a battery cell 24 on a planar surface 26 of a substrate 28, is illustrated in FIG. 1. The battery cell 24 comprises a plurality of battery component films 30 that cooperate to form a battery to receive, store, or discharge electrical energy. The films 30 can be employed in a number of different arrangements, shapes, and sizes. In one embodiment, the battery component films 30 include at least a pair of electrode films with an electrolyte film 44 therebetween. The electrode films can include one or more of a cathode current collector film 38, cathode film 42, anode film 48, and anode current collector film 52, which are all inter-replaceable. For example, the battery 20 can include (i) a pair of cathode and anode films or a pair of current collector films, (ii) both the anode/cathode films and the current collector films, or (iii) various combinations of these films, for example, a cathode film and an anode and anode current collector film but not a cathode current collector film, and so on. The exemplary versions of the battery 20 illustrated herein are provided to demonstrate features of the battery and to illustrate their processes of fabrication; however, it should be understood that the exemplary battery structures should not be used to limit the scope of the invention, and alternative battery structures as would be apparent to those of ordinary skill in the art are within the scope of the present invention.

Figure 2:
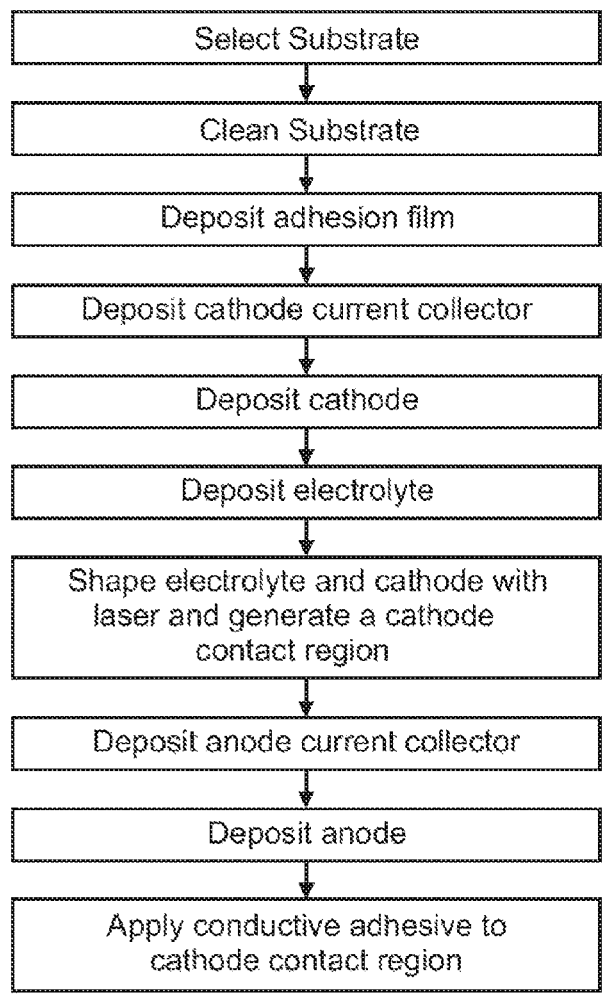
FIG. 2 is a flowchart of an embodiment of a process for forming a single-sided battery by depositing battery component films on a substrate and shaping the films with a laser.

An embodiment of a process of fabricating a thin film battery 20 is shown in FIG. 2. In the first step, a suitable battery substrate 28 is selected, the substrate 28 being a dielectric having sufficient mechanical strength to support battery component films 30 and a smooth surface for the deposition of thin films. Suitable substrates 28 can be made from, for example, ceramic oxides such as aluminum oxide or silicon dioxide; metals such as titanium and stainless steel; semiconductors such as silicon; or even polymers. One desirable substrate comprises a crystalline sheet formed by cleaving the planes of a cleavable crystalline structure. The cleavable crystalline structure splits along definite planes to create flat surfaces, and can include (i) basal cleavage crystals having cleavage planes parallel to the base of a crystal or to the plane of the lateral axes; (ii) cubic cleavage crystals having cleavage planes parallel to the faces of a cube, (iii) diagonal cleavage crystals which has cleavage planes parallel to a diagonal plane; (iv) lateral cleavage crystals which have cleavage planes parallel to the lateral planes; (v) octahedral, dodecahedral, or rhombohedral cleavage crystals in which cleavage occurs parallel to the faces of an octahedron, dodecahedron, or rhombohedron (respectively); and (vi) prismatic cleavage crystals in which cleavage occurs parallel to a vertical prism. The crystalline cleaving structure can be, for example, mica or graphite. Mica can be split into thin crystal sheets having thicknesses of less than about 100 microns or even less than about 25 microns.

Figure 3A:
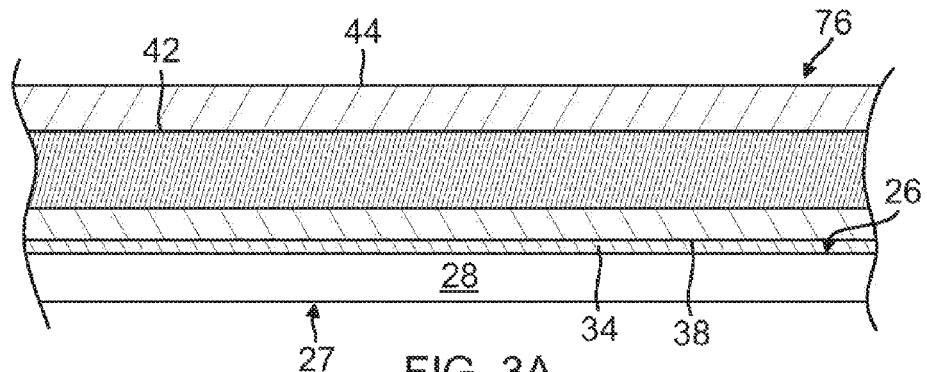
FIG. 3A is a schematic sectional side view of a partially fabricated battery preform comprising a stack of unshaped battery component films deposited on the substrate.
Figure 3B:
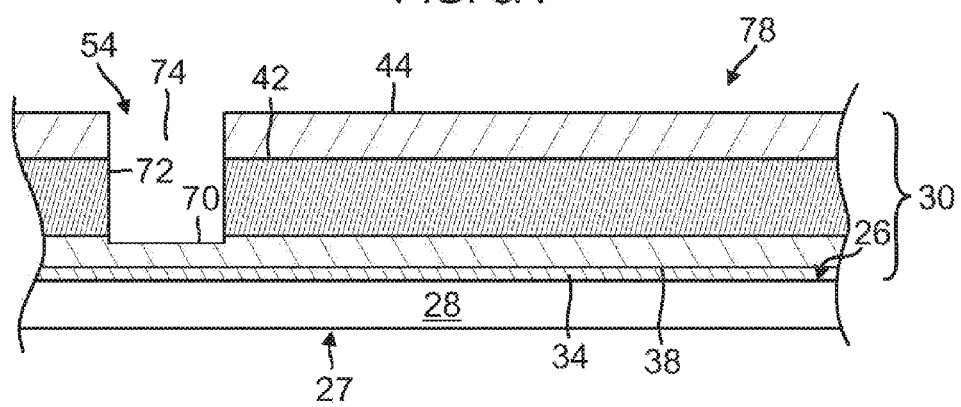
FIG. 3B is a schematic sectional side view showing the battery preform of FIG. 3A after shaping with pulsed laser beam bursts.

While a particular sequence of process steps is described in FIG. 2 to illustrate an embodiment of the process, it should be understood that other sequences of process steps can also be used as would be apparent to one of ordinary skill in the art. Referring to FIG. 2, in a first optional step, a substrate 28 is cleaned to remove surface contaminants or even annealed to remove impurities prior to processing, to obtain good adherence of deposited films. For example, the selected substrate 28 can be annealed to temperatures sufficiently high to clean the cleavage plane surface by burning-off contaminants and impurities, such as organic materials, water, dust, and other materials formed or deposited on the planar surfaces 26, 27 of the substrate 28; or even heating to temperatures high enough to remove any water of crystallization that may be present within the substrate. The annealing temperatures can be from about 150 to about 600° C., even at least about 400° C., or even at least about 540° C. The annealing process can be conducted in an oxygen-containing gas, such as oxygen or air, or other gas environments, for about 10 to about 120 minutes, for example, about 60 minutes. The cleaning process can also be conducted in an oxygen plasma containing cleaning step. After a suitably clean surface is obtained, a plurality of battery component films 30 are deposited on the surface 26 of the substrate 28, as illustrated in FIG. 3A. One or more of the films 30 can be shaped in between deposition steps for additional films 30, or even after deposition of all the films 30, to remove portions of each film or even the substrate 28, to create shaped features that can cooperate with other film layers or connector elements to form the battery 20, as illustrated in FIG. 3B.

In one embodiment, the battery component films 30 include an adhesion film 34 which is deposited on the planar surface 26 of the substrate 28 to improve adhesion of overlying battery component films 30, as shown in FIG. 3A. The adhesion film 34 can comprise a metal or metal compound, such as for example, aluminum, cobalt, titanium, other metals, or their alloys or compounds thereof; or a ceramic oxide such as, for example, lithium cobalt oxide. When the adhesion film 34 is fabricated from titanium, the titanium film is deposited in a sputtering chamber with, for example, the following process conditions: argon maintained at a pressure of 2 mTorr; DC (direct current) sputtering plasma at a power level of 1 kW, a deposition time of 30 seconds, a titanium target size of 5×20 inches, and a target to substrate distance of 10 cm. To form batteries 20 on both sides of the substrate, a second adhesion film can be deposited on the second planar surface 27 after deposition of a first adhesion film 34 on the first planar surface 26 (not shown). The adhesion film 34 can be deposited on the substrate 28 not only to cover the area under the subsequently deposited battery cells 24 and their battery component films 30 but also the area 36 extending beyond the battery component films 30. The adhesion film 34 is deposited in a thickness of from about 100 to about 1500 angstroms.

A cathode current collector film 38 is formed on the adhesion film 34 to collect the electrons during charge and discharge process. The cathode current collector film 38 is typically a conductor and can be composed of a metal, such as aluminum, platinum, silver or gold. The current collector film 38 may also comprise the same metal as the adhesion film 34 provided in a thickness that is sufficiently high to provide the desired electrical conductivity. A suitable thickness for the current collector film 38 is from about 0.05 microns to about 2 microns. In one version, the cathode current collector film 38 comprises platinum in a thickness of about 0.2 microns. The cathode current collector film 38 can be formed by deposition of platinum by DC magnetron sputtering. The sputtering conditions for depositing a platinum film from a platinum target uses sputtering gas comprising argon at a gas pressure of 5 mTorr to form a DC plasma at a power level of 40 W for 10 minutes.

The cathode film 42, comprising an electrochemically active material, is formed over the current collector film 38. In one version, the cathode film 42 is composed of lithium metal oxide, such as for example, lithium cobalt oxide, lithium nickel oxide, lithium manganese oxide, lithium iron oxide, or even lithium oxides comprising mixtures of transition metals such as for example, lithium cobalt nickel oxide. Other types of cathode films 42 that may be used comprise amorphous vanadium pentoxide, crystalline $V_2O_5$ or $TiS_2$. The cathode film can be deposited as a single film or as a stack of films, with alternate deposition and annealing steps. Typically, the cathode film stack has a thickness of at least about 5 microns, or even at least about 10 microns. The cathode film can be annealed to reduce stress in the film at a temperature of from about 200 to about 500° C. The cathode film 42 can also be annealed in a defect reducing step to temperatures from about 150 to about 700° C., for example, about 540° C., to further improve the quality of the cathode film 42 by reducing the amount of defects.

An electrolyte film 44 is formed over the cathode film 42. The electrolyte film 44 can be, for example, an amorphous lithium phosphorus oxynitride film, also known as a LiPON film. In one embodiment, the LiPON has the stoichiometric form $Li_xPO_yN_z$ in an x:y:z ratio of about 2.9:3.3:0.46. In one version, the electrolyte film 44 has a thickness of from about 0.1 microns to about 5 microns. This thickness is suitably large to provide sufficiently high ionic conductivity and suitably small to reduce ionic pathways to minimize electrical resistance and reduce stress.

The substrate 28 and one or more deposited battery component films 30 make up a battery preform 76, which can be shaped to form shaped features 54, for example to remove portions of the battery component films 30 as shown in FIG. 3A. Shaping the deposited films 30 after their deposition on the substrate 28 provides shaped features 54 that can be obtained substantially without the use of a mask. While a mask can still be used to improve the shape of the features, the present process can be performed without any mask. The shaped features 54 are positioned and sized so that they shape the battery films 30 through which the features are cut to form a battery cell 24. For example, shaped features 54 comprising holes can be used to form terminals 68, 68a,b, as shown in FIG. 3B, by depositing material into the holes. A battery preform 76 comprising substrate 28, anode current collector film 52, anode film 48 and electrolyte film 44 is shown in these drawings; however, the preform 76 can be any combination of film and substrate layers as the shaping process is easily adapted to shaping other battery film configurations and structures.

The battery preform 76 and deposited component films 30 can be shaped using a pulsed laser ablation process. In the ablation process, portions of the deposited component films 30 and even portions of the substrate 28 can be removed to shape the films 30 and cut or drill through the substrate 28. The pulsed laser bursts are applied at a sufficiently high power level to vaporize portions of the battery preform 76 to form shaped features from the deposited films 30 substantially without causing fractures along the cleavage planes of the battery substrate 28. Also, the power level of the pulsed laser beam bursts are controlled to vaporize a predetermined depth of the battery preform to form shaped features in individual films 30 to remove a portion of a film 30 or a stack of films that have been sequentially deposited onto the surface 26 of the substrate 28. The laser ablation process shapes the films 30 by controlling the power level of the laser bursts, and the location of the pulsed laser, to ablate the films deposited on the substrate 28. For example, in one embodiment, the pulsed laser beam bursts comprise beam bursts from an ultraviolet laser beam applied at a power level of from about 0.2 to about 1 watts, and with a duration of from about 40 to about 160 nanoseconds. These pulsed bursts can be provided at a pulse rate of from about 5 to about 200 Hz. The pulsed laser bursts can be moved across the battery substrate with a vectorial velocity of from about 2 to about 10 mm/s.

The pulsed laser ablation process is conducted in a dry box or dry room which is absent oxygen or moisture when the battery preform 76 includes previously deposited battery component films 30 that can oxidized, such as lithium or LIPON films. A gas nozzle 93 can also be used to blow a gas stream 95 of blowing gas onto the laser ablation region on the battery preform 76 to remove any debris or vapors from the ablation area. The gas nozzle 93 obtains the blowing gas from a gas source 96 and the gas flow rate or pressure can be controlled by a gas flow controller 97. The blowing gas can be air, argon, nitrogen, or a mixture of such gases, and the pressure of the gas can be, for example, at least 2 $Kg/cm^3$. In the ablation process, a low power laser (not shown) can also be used to indicate the position of the pulsed laser beam 98 on the battery preform 76, such as for example, a He—Ne laser.

In the film shaping process, the battery preform 76 is placed on a movable stage 84 that is capable of moving the battery preform 76 during laser shaping. The movable stage 84 can comprise a table that can be moved in the x and y directions. The movable stage 84 is positioned by a stage motor 92 which can be controlled by a programmable controller 88. The movable stage 84 and programmable controller 88 can include interpolative program code to enable movement of the table in the x-y plane using velocity or even acceleration vectors. In one embodiment, the movable stage 84 can be set to provide different levels of vectorial velocity for example from about 0.1 to about 400 mm/s, or even from 2 mm/sec to about 10 mm/sec. In another embodiment, the vectorial acceleration of the stage can be set with levels ranging from about 0.5 to about 50 $mm/sec^2$, for example, at 0.8, 4, 20, and 40 $mm/sec^2$. In one embodiment the movable stage is capable of being positioned to an accuracy of greater than about 12 microns.

The pulsed laser beam 98 provides pulsed laser bursts which have an output energy corresponding to a series of energy spikes that may be partially overlapping or entirely separated in time; in contrast to continuous wave lasers which produce a continuous laser output having a steady state equilibrium. The pulsed laser beam 98 comprises pulsed laser bursts, which for example, can have a duration in the range of nanoseconds ($10^{-9}$ sec) or femtoseconds (10-15 sec). The pulsed laser beam 98 ablates portions of the preform 76 with reduced delamination or micro-crack formation, especially when the ablation process includes removal of portions of the films 30 overlying a substrate 28 having cleavage planes. The pulsed laser beam was also found to work well on thin substrates 28 which are sized less than 100 microns because such a thin substrate would absorb too much energy from a continuous laser beam and melt or otherwise deteriorate during the cutting operation. For example, it was determined that using a high power $CO_2$ laser operated in a continuously turned-on mode to ablate portions of a substrate 28 comprising cleavage planes and having a thickness of less than 100 microns, caused excessive localized heating and the resultant thermal shock often caused cracking and delamination of the cleavage planes of the substrate 28 or even delamination of the battery component films 30 from the battery preform 76.

Figure 5:
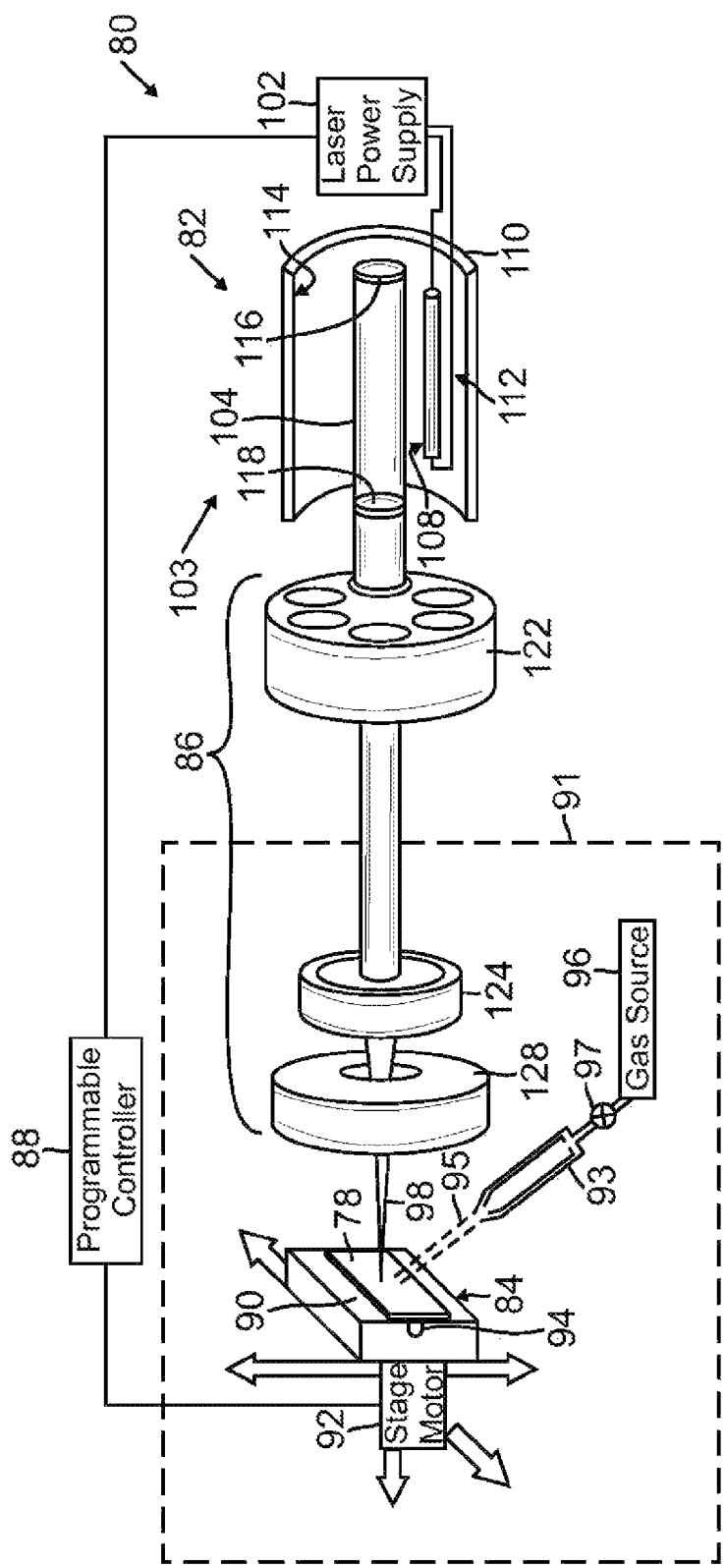
FIG. 5 is a schematic diagram of an embodiment of a pulsed laser apparatus for shaping a battery preform.
Figure 6:
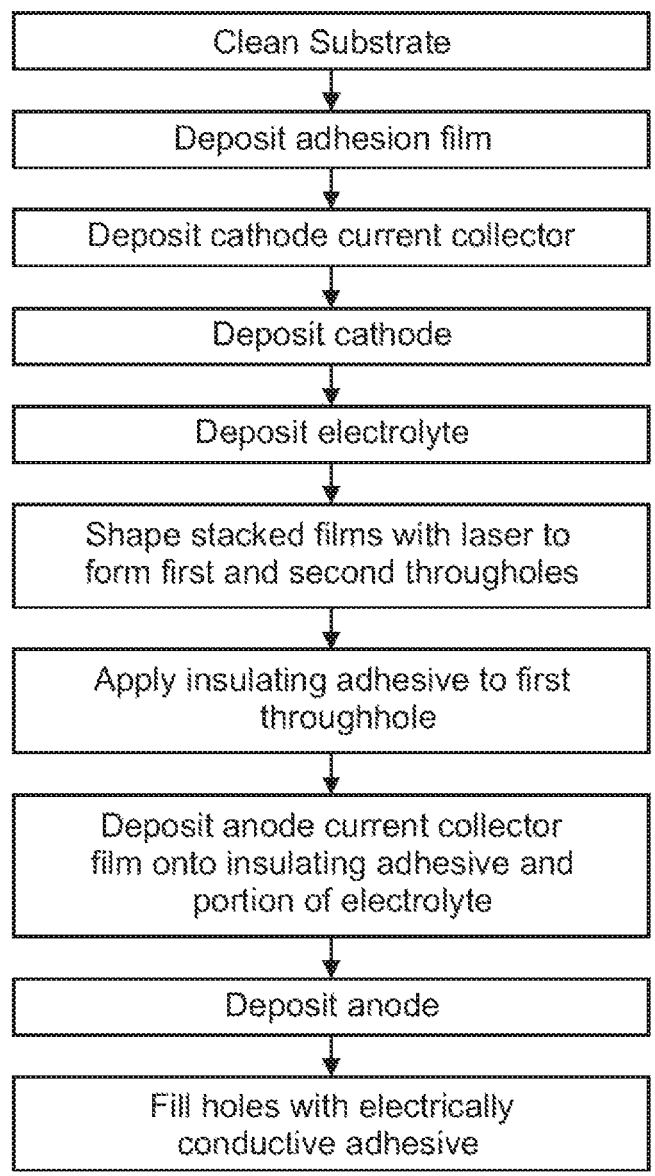
FIG. 6 is a flowchart of an embodiment of a process for forming the thin film battery of FIG. 4 by depositing battery component films on a substrate and shaping the films with laser.

In the ablation process, the pulsed laser source 82 is positioned above the movable stage 84 and is powered by a laser power supply 102 to generate a pulsed laser beam 98 as shown in FIG. 5. An exemplary pulsed laser source 82 that can provide pulsed laser bursts comprises a lasing medium 104 and laser light source 108 positioned at the twin focal points of a light resonator 110. The lasing medium 104 can be a solid-state rod material such as a titanium doped sapphire, Nd:YAG, a chromium ion doped ruby; or a gas laser which uses a combination of an inert gas and reactive gas to generate the laser beam. The light resonator 110 comprises an elliptical cavity 112 having reflective surfaces 114 which reflect photons emitted from the light source toward the lasing medium 104. These photons resonate in the lasing medium 104 between a highly reflective mirror 116 and a partially reflective output coupler 118 at either end of the lasing medium 104. The generated laser beam 120 is emitted through the partially reflective output coupler 118. For efficiency, the composition and concentration of the lasing medium 104, as well as the construction of the elliptical cavity 112 of the light resonator 110, the mirror 116, and the coupler 118, is optimized for pulsed laser operation. The continuous laser beam 120 generated by the laser source 82 is passed through a laser optical system 86 which comprises a neutral density filter 122, one or more focusing lenses 124, and a shutter 128. The neutral density filter 122 reduces the intensity of all wavelengths or colors equally. The focusing lens 124 can have a focal length of from about 1 to about 20 cm, such as for example, 10 cm. The shutter 124 comprises a mechanical shutter capable of rapidly opening and closing, such as a mode locking or electro-optical shutter. By opening and closing rapidly, the shutter 124 can generate a pulsed laser beam 98 having laser pulses with pulse durations in nanoseconds or femtoseconds, as an output of the input continuous laser beam 120.

In one version, the pulsed laser source 82 is a femtosecond laser comprising a diode-pumped solid-state laser with a lasing medium 104 comprising a rod of titanium doped sapphire. The femtosecond pulsed laser is set up to provide pulsed laser bursts having peak intensities of from about 1 to about 10 GigaWatts to shape the pulsed films 30. However, the pulsed laser bursts are so short in duration that the delivered laser energy does not have sufficient time to dissipate across more than one film 30 if so desired, or even across the thin battery preform 76 from the laser cutting beam spot to surrounding inter-lamellar cleavage planes of the battery substrate 28 via thermal conduction. Consequently, not enough heat is transferred to other battery films 30 or to the substrate 28 to ablate or otherwise damage the other films 30 or damage the planar cleavage structure of the battery substrate 28. This provides a clean laser cut with low residual fracturing about the ablation region and the absence of melting reduces splatter which would otherwise result from molten film and substrate material formed around the ablation region of the battery preform 76.

The pulsed laser source 82 can also use an ultraviolet laser to generate a continuous laser beam which is then formed into pulsed laser bursts as described above. The ultraviolet laser can be, for example, an excimer or 'excited dimer' laser, which is a chemical laser that uses a combination of an inert gas, such as argon, krypton, or xenon; and a reactive gas such as fluorine or chlorine, to generate a laser beam. Under appropriate electrical stimulation, a pseudo-molecule called a dimer—which exists only in an energized state—gives rise to laser light in the ultraviolet range which is well focused and capable of delicate control. Rather than burning or cutting material, the excimer laser adds enough energy to disrupt the molecular bonds of the surface of the battery preform 76, which then effectively ablate and disintegrate into vapor rather than burn. Thus, the ultraviolet laser can be used to remove fine layers of surface material with almost no heating or change to the material left behind. From ablation energy calculations it was determined that a suitable ultraviolet laser beam can be an excimer laser beam having a power level of from about 5 to about 80 microJoules, which is operated with a pulse duration of from about 1 to about 50 nanoseconds, and a pulse rate of from about 5 to about 200 Hz.

In one example, a pulsed laser source 80 comprising a femtosecond laser source was set to energy levels and pulse durations that allowed ablation of portions of a battery preform 76 with good results. In this example, the femtosecond pulsed laser beam 98 was set to provide an irradiance level of from about 1 to about 800 J/cm$^2$, and pulsed laser bursts having a pulse duration of from about 50 to about 600 femtoseconds, for example, about 150 femtosecond. Based on this pulse duration, a suitable fluence level for the femtosecond pulsed laser beam 98 was calculated to be from about 10 to about 800 J/cm$^2$. The pulse can be set to be from about 2 microJoules to about 100 millijoules, in one example, about 750 microJoules. The pulse repetition rate should also be set to provide good cutting, and in one example, the pulse repetition rate was set to be from about 50 to about 1000 Hz, for example, about 125 Hz.

The pulsed laser beam 98 can be set to provide laser pulses having a desired peak laser fluence that is selected in relation to the type of battery component films 30 and substrate 28 to be shaped, and the desired shaping parameters. As the pulsed laser cutting process can also be employed at any of several different stages of the battery fabrication process, the energy density required for the pulsed laser beam 98 depends on the thickness of, and layers formed on, the battery substrate 28. The energy density or fluence of a pulsed laser beam 98 which was needed to shape a battery preform 76 comprising a mica substrate with titanium adhesion film, platinum cathode current collector film and a lithium metal oxide cathode film thereon, was estimated to be at least about 8 J/cm$^2$. As another example, shaping a thin adhesion layer 34 or cathode current collector film 38 required a pulsed laser beam 98 having a peak laser fluence of less than 0.2 J/cm$^2$. Without the thicker cathode layer 42, a much lower threshold of energy level was needed. However, the energy density required to shape a battery preform 76 comprising a mica substrate 28 and additionally, a cathode film 42 of platinum or titanium in a thickness of less than about 40 micron, was estimated to be less than 1.5 J/cm$^2$. Thus, when shaping a battery preform 76 of mica with battery component films 30 including the adhesion film 34, cathode current collector film 38, and cathode film 42, and having a total thickness of about 40 microns, the pulsed laser beam 98 was set to provide a peak laser fluence of at least about 8 J/cm$^2$.

After shaping the battery preform 76, the remaining battery component films 30 are deposited onto the shaped preform 78 to construct the thin film battery cell(s) 24. An anode film 48 is formed on the shaped battery preform 78 on the electrolyte film 44. The anode film 48 can be the same material as the cathode film, as already described. A suitable thickness is from about 0.1 microns to about 20 microns. In one version, anode film 48 is made from lithium which is also sufficiently conductive to serve as the anode current collector film 52, and in this version the anode film 48 and anode current collector film 52 are the same. In another version, the anode current collector film 52 is deposited onto a region of the electrolyte and an anode film is deposited onto the electrolyte and onto a portion of the anode current collector film, wherein the anode current collector film comprises the same material as the cathode current collector film 38 to provide a conducting surface from which electrons may be dissipated or collected from the anode film 48. For example, in one version, the anode current collector film 52 comprises a non-reactive metal such as silver, gold, platinum, in a thickness of from about 0.05 microns to about 5 microns.

In the version shown in FIG. 3B, an anode current collector film 52 is selectively deposited onto the shaped battery preform 78 onto a region of the electrolyte film 44 that is away from the shaped feature 54. The anode film 48 is then deposited onto the electrolyte 44 and part of the anode current collector film 52.

Figure 4:
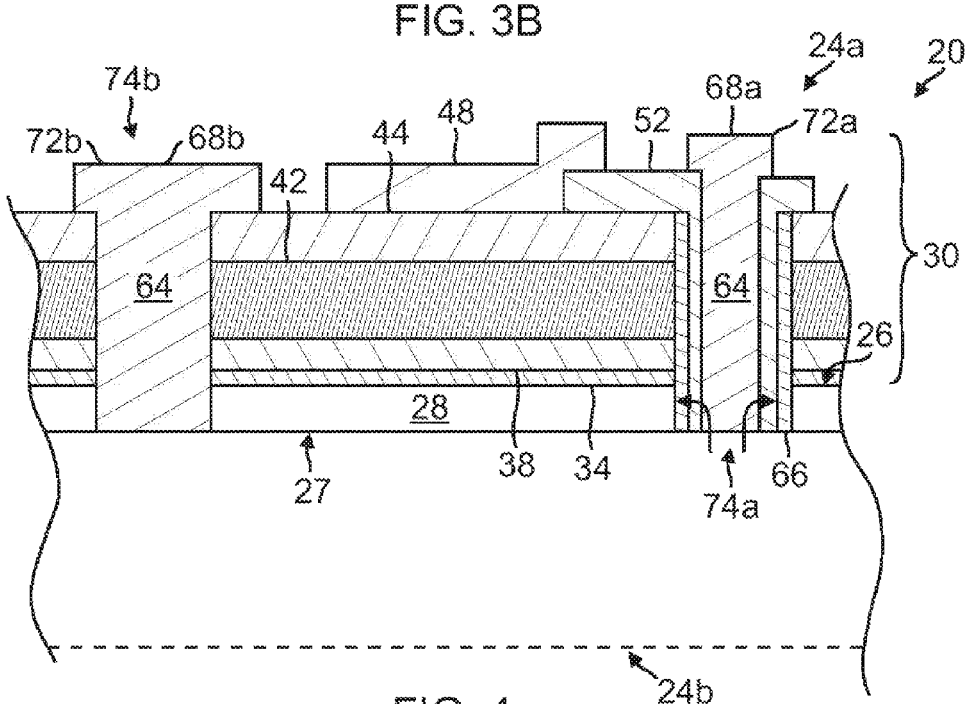
FIG. 4 is a schematic sectional side view of another embodiment of a thin film battery formed which has battery cells on both sides of the substrate.

In another embodiment, the battery 20 can include a first battery cell 24a on a first planar surface 26 of the substrate 28, and a second battery cell 24b on a second planar surface 27 of the same substrate 28, as shown in FIG. 4. The multiple battery cells can also be placed on the same surface or side of the substrate 28 (not shown). Versions of the battery 20 with two opposing cells can be formed using the same processes used to form the battery 20 with the single battery cell 24 by flipping over the substrate 28 to form the battery film components of the second battery cell, or after processing of the first battery cell 24. Alternatively, the battery film components of the second battery cell can be formed simultaneously with the battery component films 30 of the first cell 24, using chambers having dual or multiple process zones covering each side of the substrate 28.

Figure 7A:
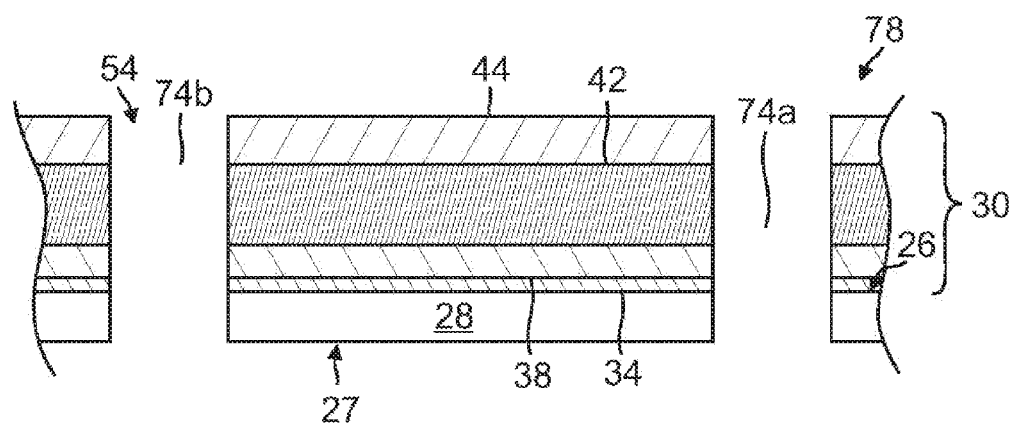
FIG. 7A is a schematic sectional side view showing the battery preform of FIG. 3A after laser shaping according to another embodiment of a shaping method.

FIG. 7A shows a version of a shaped battery preform configured for a substrate with battery terminals accessible from top and bottom sides of the substrate. This version can be used for stacked batteries in which the battery substrates are layered one on top of the other and the anode and cathode terminals are electrically connected to each other along the stack. Alternately, this version can be used for substrates having a battery cell on both the top and bottom sides of the substrate, where the through-holes serve to electrically connect the anode and the cathode of the first cell to the anode and the cathode of the second cell. An electrical connection is formed between the top and bottom surfaces of the battery cell 24 by filling the through-holes 74a,b with an electrically conductive material. The connection and can even be selectively polarized by selectively coating the sides of one or more through-hole 74a,b with electrically insulating adhesive 66 prior to insertion of the conductive material. In the version shown in FIG. 7B electrically insulating adhesive 66 is applied to the sidewalls of a first through-hole 74a and an anode current collector film deposited thereon 52.

A pulsed laser, as described herein, can be used to form through-holes 74a, 74b that extends through the thickness of the battery preform 76. For battery preform 76 comprising mica substrate with deposited films on a single surface of the substrate 28, good through-hole formation results were obtained by applying the pulsed laser initially from a top side and then from the reversed bottom side to finish the cut. With this procedure, the second planar surface 27 of the substrate 28 was not broken through, reducing the cleavage fracture and damage that would otherwise occur with such breakthrough.

Figure 7B:
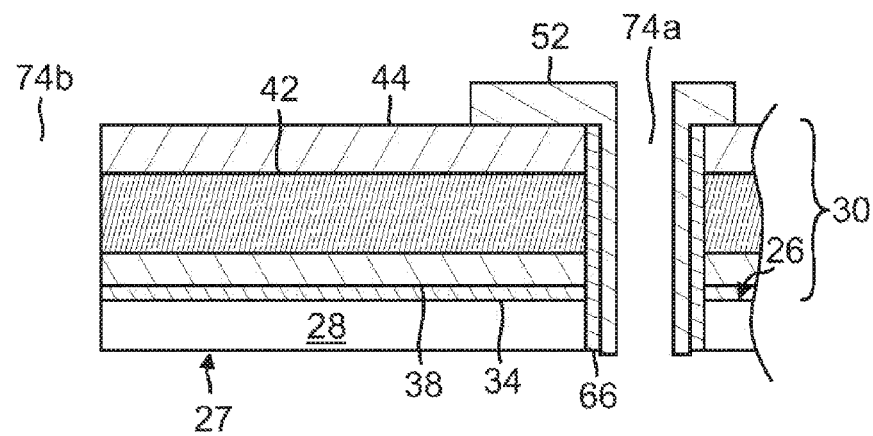
FIG. 7B is a schematic sectional side view of the shaped preform of FIG. 7A having insulating adhesive and anode current collector deposited thereon.

After formation of the shaped features 54, portions of the features can be coated to create selectively insular or conductive regions on the shaped battery preform 78. Insulating adhesive can be applied to selected surfaces of the shaped preform to change the electrical contact properties of the surface. As shown in FIG. 7B, the sidewalls of through-hole 74a were coated with electrically insulating adhesive 66 to allow electrical connectors 72a to extend through the battery from a top surface to a bottom surface of the shaped preform 78 substantially without contacting the intermediary layers, as shown in FIG. 4. The electrically insulating adhesive 66 can be an epoxy or any insulating resin or ceramic thin film and is applied in a thickness sufficiently large to prevent current drain therethrough. A suitable electrically insulating adhesive 66 comprises an electrical specific resistivity larger than $10^8$ ohm·cm. In one version the electrically insulating adhesive 66 comprises an epoxy resin such as Hardman® low viscosity epoxy, available from Royal Adhesives & Sealants, LLC of South Bend, Ind., USA. The electrically insulating adhesive 66 can be applied in a thickness of from about 0.2 to about 10 microns. In one embodiment the electrically insulating adhesive comprises epoxy and is applied in a thickness of from about 0.5 to about 5 microns.

The configuration shown in FIGS. 4 and 7B enables electrical contact between the anode and an anode contact material. The anode contact material can comprise an electrically conductive post or a blob of electrically conducting adhesive 64 that is inserted into the through-hole 74a to substantially contact the anode current collector film 52 on the sidewalls of the through-hole 74a and which can even form a terminal of the battery 20.

Electrical contact pads 68, 68a,b can be formed by application of an electrically conductive material to the shaped features 54 or exposed regions of the current collector films. The electrical contact pad 68 of FIG. 2B comprises an electrically conductive adhesive 64 that is flowed into the shaped feature of the battery preform 76. The electrically conductive adhesive contacts 64 the cathode current collector film 38 and provides a conductive pathway between the cathode current collector film 38 and the top surface of the battery 20. The upper surface of the electrically conductive adhesive 64 can serve as a contact pad 68 for electrical connection of the battery cell 24 to other battery cells or electrical circuit elements.

After the deposition of all the battery component films 30, or even after electrically conductive adhesive 64 is applied to form electrical contact pads 68a,b, a variety of protective layers or electrically conducting layers can be formed over the battery component films 30 to provide protection against environmental elements. The protective layer can comprise polymer, ceramic or metal layers or combinations of layers. In one example, the protective layer comprises a plurality of polymer and ceramic layers that are superimposed on each other.

Figure 8A:
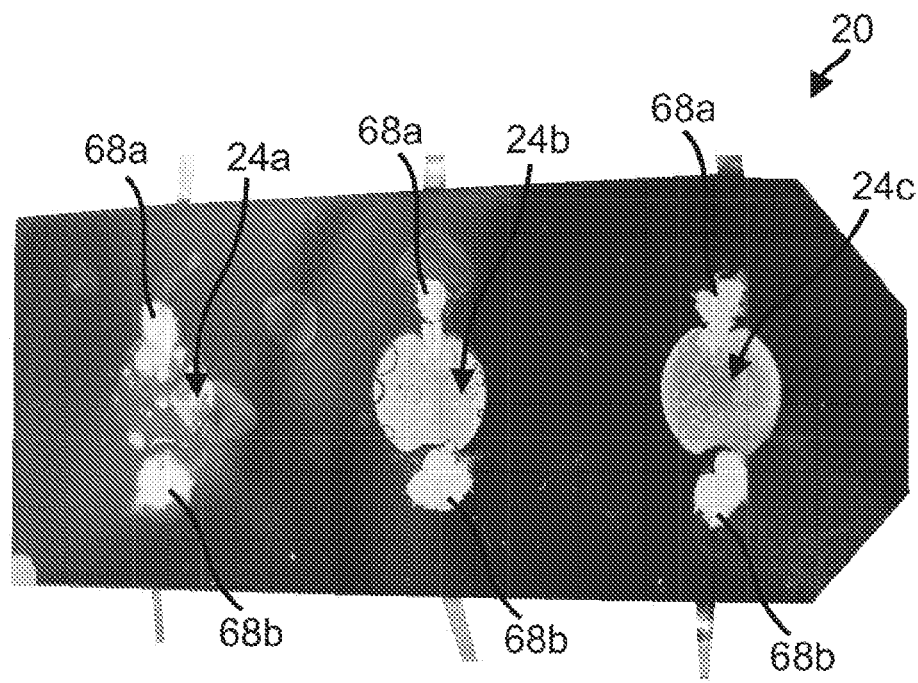
FIGS. 8A and 8B are photographs of a top side and bottom side of a battery having films shaped by a laser.
Figure 8B:
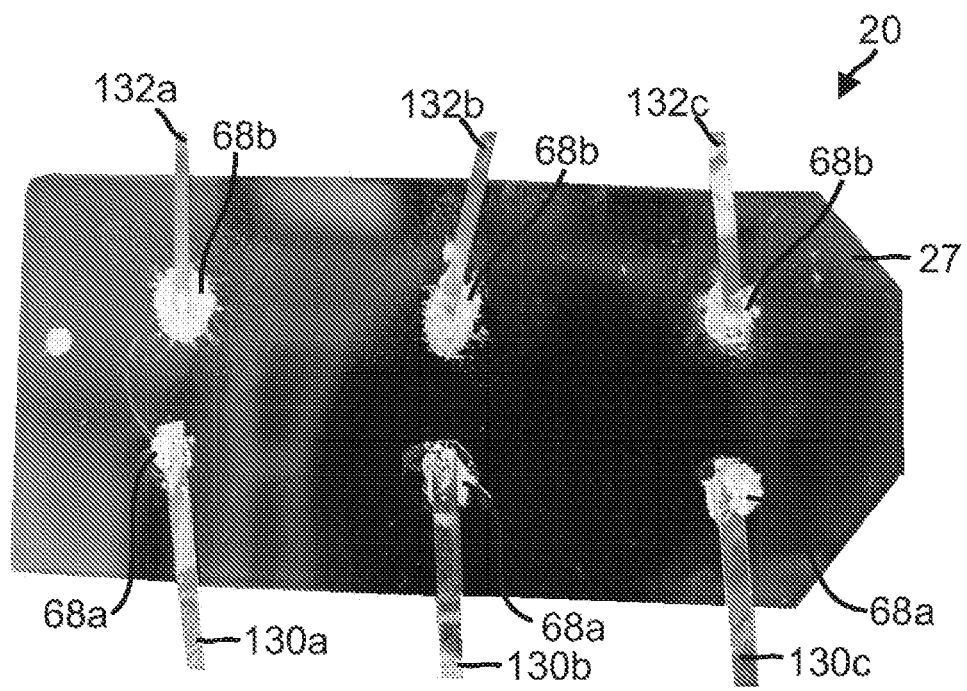

The thin film battery 20 can also be fabricated to provide a plurality of battery cells 24a-c on a single substrate 28, as shown in FIGS. 8A and 8B. The battery cells 24a-c are be arranged horizontally across a single substrate surface 26, however they can alternately be fabricated on the front surface 26 and backside surface 27 of a battery substrate 28 (not shown) to substantially increase the energy density and capacity of the battery cell 24.

A plurality of battery cells can be deposited on a wafer of battery substrate and thereafter the wafer can be cut into smaller pieces that each form battery substrates 28 having one or more battery cells 24 thereon, or to form individual batteries 20. A pulsed laser cutter 80 can be used to cut the substrate wafer, which is simply a larger section of battery substrate material. The wafer can be cut into individual battery wafers before, after partial completion of, or after entirely completing, processing battery component films 30 that cooperate to form one or more battery cells 24a-c on each battery substrate 28. In one embodiment the laser cutter 80 comprises a pulsed laser source 82, a movable stage 84, a laser optical system 86, and a programmable controller 88 that are operated to cut the substrate to the desired cutting pattern.

EXAMPLES

The following examples are provided to illustrate applications of the present battery and fabrication methods, but should not be used to limit the scope of the invention.

The multi-cell battery 20 shown in FIGS. 8A and 8B comprises a mica substrate with adhesion layer, cathode current collector, cathode, electrolyte, anode current collector and anode films. The mica substrate has a thickness of about 15 microns. An adhesion layer was applied to the substrate, comprising lithium cobalt oxide with a thickness of from about 0.1 to about 0.2 microns. A cathode current collector comprising platinum with a thickness of about 0.2 microns was deposited onto the adhesion layer. A cathode film comprising LIPON film with a thickness of about 2 microns was deposited onto the cathode current collector.

After deposition of the adhesion layer, cathode current collector, cathode and electrolyte, the battery preform was shaped using a pulsed laser source 82 comprising a UV solid-state diode pumped laser comprising a Nd:YAG (neodymium-doped yttrium aluminium garnet) lasing medium 104. The UV Nd:YAG laser is capable of emitting light in a wavelength of about 355 nm. An exemplary Nd:YAG UV laser is, for example, a 3W Hawk-II UV laser, available from Quantronix®, Long Island, N.Y. The pulsed laser source 82 was operated with a pulse frequency of about 6 kHz and pulse duration of about 80 nanoseconds, and with an average output power of about 0.5 W while shaping.

After laser shaping, a thin layer of insulating material was applied to a hole in the battery preform. Additional films comprising an anode current collector film followed by an anode film were then deposited onto the shaped preform. The anode current collector film comprises a copper film with a thickness of about 0.2 microns. An anode film comprising lithium with a thickness of from about 2 to about 3 microns was deposited onto the electrolyte and covering a portion of the anode current collector film.

The battery was measured to provide an output voltage in the range of from about 3.8 to about 4.2 Volts. Each battery cell 24 had a capacity of about 0.1 mA hr and corresponding energy density of about 200 W·hr/liter. The complete cells 24 have a diameter of about 7.5 mm.

While illustrative embodiments of the thin film battery are described in the present application, it should be understood that other embodiments are also possible. Also, the packaging assembly of the present invention can be applied to contain and hermetically seal other type of batteries, as would be apparent to those of ordinary skill in the art. Thus, the scope of the claims should not be limited to the illustrative embodiments.

What is claimed is:

1. A method of fabricating a battery on a battery substrate, the method comprising:
   (a) selecting a battery substrate having cleavage planes;
   (b) depositing one or more battery component films on the battery substrate, the battery component films comprising electrode films at least partially surrounding an electrolyte film, and at least one battery component film comprising a metal or metal compound; and
   (c) applying to the battery component film comprising the metal or metal compound, a plurality of pulsed laser beam bursts from an ultraviolet laser beam set at a power level of from about 0.2 to about 1 watt, the pulsed laser beam bursts having a duration of from about 40 to about 160 nanoseconds to vaporize a portion of the battery component film comprising the metal or metal compound substantially without causing fractures along the cleavage planes of the battery substrate.

2. A method according to claim 1 wherein the battery substrate comprises a mica substrate.

3. A method according to claim 1 comprising applying the pulsed laser beam bursts at a pulse rate of from about 5 to about 200 Hz.

4. A method according to claim 1 comprising applying pulsed laser beam bursts having a fluence of from about 1 to about 800 J/cm².

5. A method according to claim 4 wherein the pulsed laser beam bursts are moved across the battery substrate with a vectorial velocity of from about 2 to about 10 mm/s.

6. A method according to claim 1 wherein in (b), the battery component films comprise (i) electrode films that include one or more of a cathode current collector film, cathode film, anode film, and anode current collector film, and (ii) an adhesion film.

7. A method according to claim 1 wherein (b) comprises depositing at least one battery component film comprising a metal or metal compound comprising aluminum, cobalt, titanium, lithium, or nickel.

8. A method according to claim 1 wherein (b) comprises depositing an electrode film that is a cathode film comprising at least one of: lithium cobalt oxide, lithium nickel oxide, lithium manganese oxide, lithium iron oxide, lithium cobalt nickel oxide, vanadium pentoxide and titanium disulfide.

9. A method according to claim 1 wherein (b) comprises depositing an electrode film that is a cathode film and depositing an electrolyte film over the cathode film, the electrolyte film comprising an amorphous lithium phosphorous oxynitride film.

10. A method of fabricating a battery on a battery substrate, the method comprising:
    (a) selecting a battery substrate having cleavage planes;
    (b) depositing one or more battery component films on the battery substrate, the battery component films comprising electrode films at least partially surrounding an electrolyte film, at least one battery component film comprising lithium or a lithium metal oxide; and
    (c) applying to the battery component film comprising the lithium or lithium metal oxide, a plurality of pulsed laser beam bursts from an ultraviolet laser beam set at a power level of from about 0.2 to about 1 watt, the pulsed laser beam bursts having a duration of from about 40 to about 160 nanoseconds to vaporize a portion of the battery component film substantially without causing fractures along the cleavage planes of the battery substrate.

11. A method according to claim 10 wherein the battery substrate comprises a mica substrate.

12. A method according to claim 10 comprising applying the pulsed laser beam bursts at a pulse rate of from about 5 to about 200 Hz.

13. A method according to claim 10 wherein the pulsed laser beam bursts are moved across the battery substrate with a vectorial velocity of from about 2 to about 10 mm/s.

14. A method according to claim 10 wherein (b) comprises depositing an electrode film at least one of lithium cobalt oxide, lithium nickel oxide, lithium manganese oxide, lithium iron oxide and lithium cobalt nickel oxide.

15. A method according to claim 10 wherein (b) comprises depositing an electrolyte film comprising amorphous lithium phosphorous oxynitride.

16. A method according to claim 10 wherein the battery substrate comprises a mica substrate.

17. A method according to claim 10 comprising applying the pulsed laser beam bursts at a pulse rate of from about 5 to about 200 Hz.

18. A method according to claim 10 wherein the pulsed laser beam bursts are moved across the battery substrate with a vectorial velocity of from about 2 to about 10 mm/s.

19. A method according to claim 10 wherein (c) comprises applying the pulsed laser beam bursts in a dry box or dry room which is absent oxygen or moisture.

20. A method of fabricating a battery on a battery substrate, the method comprising:
    (a) selecting a battery substrate having cleavage planes;
    (b) depositing one or more battery component films on the battery substrate, the battery component films comprising an electrode film at least partially surrounding an electrolyte film, and
       (i) the electrode film comprising at least one of lithium cobalt oxide, lithium nickel oxide, lithium manganese oxide, lithium iron oxide and lithium cobalt nickel oxide; and (ii) the electrolyte film comprising amorphous lithium phosphorous oxynitride; and
(c) applying to the electrode or electrolyte film, a plurality of pulsed laser beam bursts from an ultraviolet laser beam set at a power level of from about 0.2 to about 1 watt, the pulsed laser beam bursts having a duration of from about 40 to about 160 nanoseconds to vaporize a portion of the electrode or electrolyte film substantially without causing fractures along the cleavage planes of the battery substrate.

* * * * *